United States Patent
Sampigethaya et al.

(10) Patent No.: US 8,213,242 B2
(45) Date of Patent: Jul. 3, 2012

(54) MEMORY CELLS HAVING A ROW-BASED READ AND/OR WRITE SUPPORT CIRCUITRY

(75) Inventors: Shreekanth Sampigethaya, San Jose, CA (US); Bharath Upputuri, Santa Clara, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/888,860

(22) Filed: Sep. 23, 2010

(65) Prior Publication Data
US 2012/0075939 A1    Mar. 29, 2012

(51) Int. Cl.
*G11C 7/00* (2006.01)
(52) U.S. Cl. .................. 365/189.15; 365/230.03
(58) Field of Classification Search ............. 365/189.17, 365/230.03, 189.15
See application file for complete search history.

(56) References Cited

U.S. PATENT DOCUMENTS

| | | | |
|---|---|---|---|
| 7,054,186 B2 * | 5/2006 | Iwata | 365/158 |
| 2004/0132232 A1 * | 7/2004 | Noble | 438/142 |
| 2006/0039194 A1 * | 2/2006 | Hidaka | 365/171 |
| 2009/0103390 A1 * | 4/2009 | Kim et al. | 365/230.05 |

* cited by examiner

*Primary Examiner* — Michael Tran
(74) *Attorney, Agent, or Firm* — Lowe Hauptman Ham & Berner, LLP

(57) ABSTRACT

A circuit comprises a plurality of memory cells in a row, at least one write word line, and a write support circuit coupled to the at least one write word line and to the plurality of memory cells in the row. The write support circuit includes a first current path and at least one second current path. A current path of the at least one second current path corresponds to a respective write word line of the at least one write word line. A write word line of the at least one write word line is configured to select the first current path when the plurality of memory cells in the row operates in a first mode, and to select a second current path of the at least one second current path when the plurality of memory cells in the row operates in a second mode.

19 Claims, 5 Drawing Sheets

US 8,213,242 B2

MEMORY CELLS HAVING A ROW-BASED READ AND/OR WRITE SUPPORT CIRCUITRY

FIELD

The present disclosure is generally related to memory cells having a row-based read and/or write support circuitry.

BACKGROUND

Leakage current is commonly found in memories including, for example, static random access memories (SRAM), register files, etc. Generally, the higher the number of ports (e.g., read and/or write ports) for the memory, the higher the current leaks. Existing approaches have different methods to reduce the leakage current. For example, in some approaches the ground reference level (e.g., voltage VSS) is raised and/or the operational supply voltage (e.g., voltage VDD) is lowered, e.g., by a voltage dropped across a diode at the whole memory array level. In some approaches, when the memory is segmented, the whole segment has its voltage VSS and/or voltage VDD raised and/or lowered. Raising voltage VSS and/or lowering voltage VDD at the segment level or the memory array level affect the whole segment or memory array operation, including the power consumption and/or speed.

In some approaches, the bit line of the read port for the whole column of memory cells is floated during the retention period to reduce the leakage current. In these approaches, the whole accessed column is disabled during the time the bit line is floated, and before accessing the data, raising the bit line back to voltage VDD is required, which impacts the dynamic power because the VDD nodes for the whole segment/array are coupled together and have a large capacitance. As a result, the memory speed is compromised.

In some other approaches, high threshold voltage (HVT) bit cells are used, but the memory access time is then also increased.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
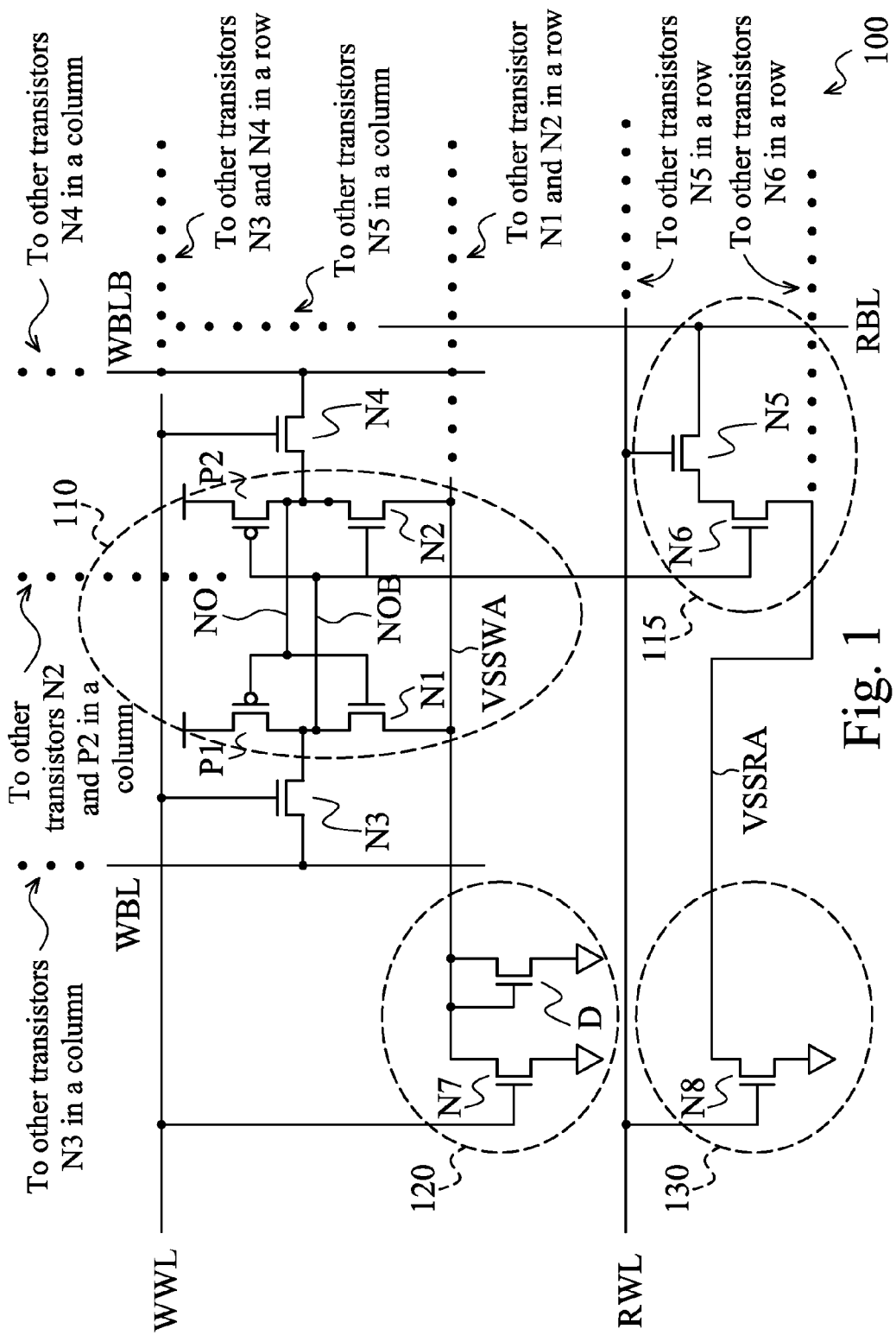
FIG. 1 is a diagram of an exemplary circuit, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. In some embodiments, the leakage current with respect to the read operation is reduced because the ground reference level in un-accessed rows is floated without affecting the content of the bit cell or changing the static noise margin (SNM) of the six-transistor (6T) portion of the bit cell. In some embodiments, the leakage current with respect to the write operation is also reduced because the ground reference of the 6T portion for un-accessed rows is raised. The leakage current reduction is substantial when the number of ports (e.g., read and/or write ports) increases. In some embodiments, the leakage current is saved on a per-row basis with respect to both a write operation and a read operation. For example, in some embodiments, in a read or a write operation, one row is accessed while leakage current in the un-accessed rows is reduced (e.g., in the write operation) or eliminated (e.g., in the read operation).

Exemplary Circuit

FIG. 1 is a diagram of an exemplary circuit 100 illustrating an operation of a memory cell (e.g., bit cell) 110, in accordance with some embodiments.

Memory cell 110 is commonly used in a memory array in, e.g., an SRAM, a register file, etc. The memory array is arranged in a plurality of rows and columns, which, for simplicity, is not shown. Depending on configurations, the number of memory cells in a row and in a column of the memory array varies, for example, 64, 128, 256, 512, etc., memory cells. For illustration, a memory array having a number of rows n (e.g., from row R-1 to row R-n) and a number of columns m (e.g., from column C-1 to column C-m) is used for explanation in this document, where n and m are any integer number.

Transistors P1, P2, N1, and N2 form a cross-latch for a memory cell 110. Alternatively explained, transistors P1 and N1 form a first inverter, e.g., inverter INV1 (not labeled) while transistors P2 and N2 form a second inverter, e.g., inverter INV2 (not labeled), and inverters INV1 and INV2 form the cross latch for memory cell 110. A node VSSWA couples the sources and the substrates of transistors N1 and N2 in a same row, and serves as a ground reference for transistors N1 and N2 or for memory cells 110 in the same row.

In some embodiments, when a write access occurs, the data is written to all memory cells in a row of the memory array. A write word line WWL controls all memory cells 110 in the same row. Write bit lines WBL and WBLB couple a plurality of memory cells 110 in a column. Write bit lines WBL and WBLB together with the corresponding pair of transistors N3 and N4 are commonly called a write port of a memory cell 110. In some embodiments, the data in a write cycle inserted at bit lines WBL and WBLB are written to the corresponding nodes NO and NOB of the corresponding memory cell 110 that are activated by the write word line WWL. Storage nodes NO and NOB store the data for a corresponding memory cell 110. In some embodiments, the data stored in nodes NO and NOB are complementary to each other. For example, if a node NO stores a Low then the corresponding node NOB stores a High, and if a node NO stores a High, then the corresponding node NOB stores a Low. In some embodiments, write bit lines WBL and WBLB are charged to a High (e.g., by a charging circuit, not shown) when the corresponding memory cell 110 is not in a write access mode.

Transistors N3 and N4 serve as a mechanism for transferring data between write bit lines WBL and WBLB and the respective nodes NO and NOB. For example, to write to a memory cell 110, the corresponding write word line WWL is activated (e.g., applied with a High) to turn on the corresponding transistors N7, N3, and N4. The data inserted at write bit lines WBL and WBLB are then transferred via the respective transistors N3 and N4 to the respective nodes NO and NOB. For example, when write word line WWL of row R-1 (labeled in FIG. 4) is activated, transistors N3 and N4 of memory cells 110 in row R-1 are activated and the data in all write bit lines WBL and WBLB in row R-1 are written to the corresponding nodes NO and NOB. Once the data for the memory cells 110 are written to nodes NO and NOB, the corresponding write word line WWL is de-activated (e.g., driven Low).

In some embodiments, a circuit (e.g., a write support circuit) 120 is used for all memory cells 110 in a row of the memory array. A node VSSWA is coupled to the sources of transistors N1 and N2 of all memory cells 110 in a same row and to the drain of transistor N7 and the drain of the transistor forming diode D in the corresponding circuit 120. A Node VSSWA is also coupled to the substrates of transistors N1, and N2. A circuit 120 serves as current paths and reduces the leakage current with respect to the write operation of memory cells 110 in the corresponding row. For example, when a row (e.g., row R-1) is accessed, other rows (e.g., row R-2 to row R-n) are un-accessed. In un-accessed row R-2 to row R-n, the word bit lines WWL are de-activated, and the corresponding transistors N7 are therefore turned off, which electrically disconnects the memory cells 110 from ground via transistors N7. At the same time, the corresponding diodes D serve as a current path for the corresponding memory cells 110. As a result, the corresponding nodes VSSWA in row R-2 to row R-n are raised by a voltage, e.g., voltage VtD, which is dropped across the corresponding diode D. Because the voltages at nodes VSSWA are raised, the leakage current in memory cells 110 is reduced. For example, when a node NO stores a High, transistor N2 is on, but transistor N1 is off, the voltage at node VSSA and thus at the substrate of transistor N1 is raised. Consequently, the voltage swing between the operational voltage of transistor N1 to the substrate is reduced, which reduces the leakage current. Circuit 120 is shown for illustration, other circuits that can provide the current paths and/or raise the voltage level at node VSSWA are within the scope of the various embodiments. For example, a transistor N7 can be replaced by a switch, a PMOS transistor having the gate controlled by an inverter inverting the read word line WWL, etc. Similarly, diodes D can be replaced by either NMOS or PMOS transistors having the gates controlled by respective regulators, reference voltages, or the like.

In some embodiments, when a read access occurs, the data from all memory cells in a row of the memory array is read. Further, a read word line RWL controls all circuits 115 in a row. A node VSSRA couples the sources of transistors N6 of circuits 115 in a row. A circuit 115 is commonly called a read circuit, and together with the corresponding read bit line RBL is commonly called a read port for a corresponding memory cell 110. To read data from a node, e.g., node NO of a memory cell 110, the data is detected at the corresponding read bit line RBL. For example, at the time of reading a memory cell 110 in a column, e.g., column C-1 (labeled in FIG. 4), the corresponding read word line RWL is activated to turn on transistors N5 and N8, and if the read bit line RBL of column R-1 is detected to be High, then the corresponding node NO stores a Low (and the corresponding node NOB stores a High). But if the read bit line RBL is detected to be Low, then the corresponding node NO stores a High (and the corresponding node NOB stores a Low). In some embodiments, a read bit line RBL is charged to a High (e.g., by a charge circuit, not shown), when the corresponding memory cell 110 is not in a read access mode.

In some embodiments, a circuit (e.g., a read support circuit) 130 is used for all memory cells 110 in a row of the memory array. A read word line RWL, which is coupled to the gate of transistor N8 of circuit 130, is coupled to the gate of transistor N5 in all memory cells 110 in the corresponding row. A circuit 130 serves as a current path and to float node VSSRA to reduce/eliminate leakage current with respect to the read operation of the memory cells 110 in the corresponding row. For example, in some embodiments, when a row (e.g., row R-1) is accessed, other rows (e.g., row R-2 to row R-n) are un-accessed. In un-accessed row R-2 to row R-n, the read word lines RWL are inactivated and thus turn off transistors N6. As a result, nodes VSSRA of row R-2 to row R-n are floating, and there is no leakage current from read bit lines RBL through transistors N5 and N6 in row R-2 to row R-n. Circuit 130 is shown for illustration, other circuits that can provide a current path and/or float node VSSRA are within the scope of the various embodiments. For example, the NMOS transistor N8 can be replaced by a switch or by a PMOS transistor controlled by an inversed read word line RWL (e.g., inverted read word line RWLI), etc.

Exemplary Writing Method

Figure 2:
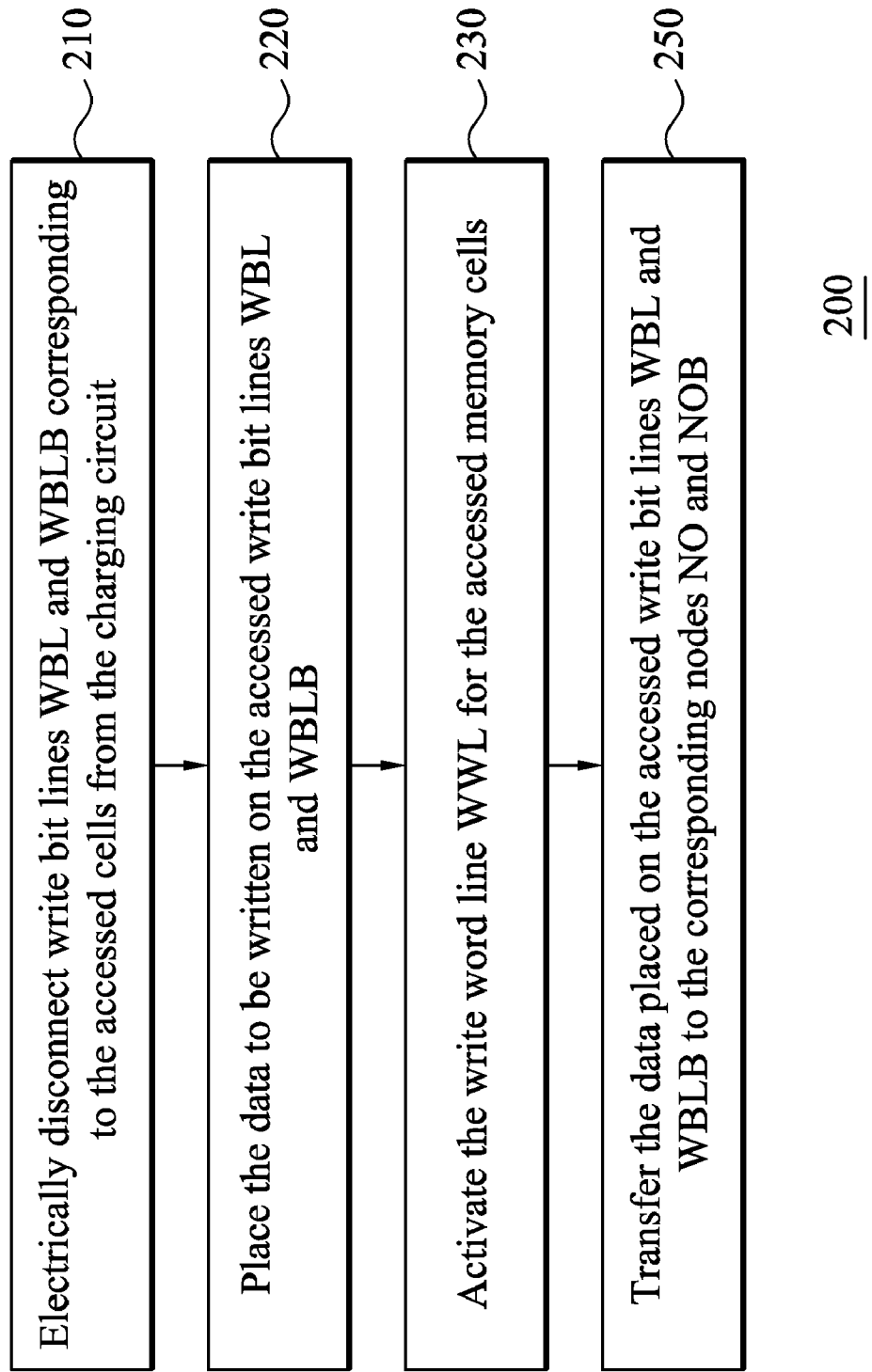
FIG. 2 is a flowchart illustrating a read operation of the circuit in FIG. 1, in accordance with some embodiments.

In some embodiments, writing data to a memory cell 110 results in writing data to a row of memory cells 110 in a memory array. FIG. 2 is a flowchart 200 illustrating a method of writing data to a row (e.g., row. R-1) of memory cells 110, in accordance with some embodiments. In an array having n number of rows and m number of columns, row R-1 is called the write access row while row R-2 to row R-n are called the un-accessed rows.

In step 210, write bit lines WBL and WBLB corresponding to the memory cells 110 in accessed row R-1 (e.g., accessed write bit lines WBL and WBLB) are configured to be independent of (e.g., electrically disconnected from) the charging circuit.

In step 220, the data to be written to memory cells 110 in accessed row R-1 is placed at the corresponding accessed bit lines WBL and WBLB.

In step 230, the write word line WWL for accessed row R-1 (e.g., write word line WWL(1), not shown) is activated, which turns on transistors N3 and N4 in memory cells 110 of accessed row R-1. Write word line WWL(1) also turns on transistor N7 of circuit 120 corresponding to accessed row R-1 (e.g., transistor N7(1), not shown). As a result, transistor N7(1) serves as a current path for memory cells 110 in accessed row R-1.

In some embodiments, the write word line WWL for row R-2 to row R-n (e.g., write word line WWL(2) to WWL(n), not shown) are in a default condition of being deactivated, which turns off transistors N3 and N4 in memory cells 110 in un-accessed row R-2 to row R-n. In effect, the deactivated write word lines WWL(2) to WWL(n) prevent memory cells 110 in un-accessed row R-2 to row R-n from being written to. Write word lines WWL(2) to WWL(n) also turn off transistors N7 in un-accessed row R-2 to row R-n (e.g., transistors N7(2) to N7(n), not shown). As a result, diodes D in un-accessed row R-2 to row n (e.g., diodes D(2) to D(n), not shown) serve as current paths for memory cells 110 in un-accessed row R-2 to row R-n, which cause the voltage levels at nodes VSSWA in un-accessed row R-2 to row R-n (e.g., nodes VSSWA(2) to VSSWA(n), not shown) to be raised by voltage VtD. Consequently, the leakage current in memory cells 110 in un-accessed row R-2 to row R-n is reduced compared with the situations where nodes VSSWA(2) to VSSWA(n) are not raised.

In step 250, the data in write bit lines WBL and WBLB is transferred (e.g., written to) the corresponding nodes NO and NOB.

In the above illustration of flowchart 200, activating write word line WWL(1) and deactivating write word lines WWL (2) to WWL(n) can be done at the same time or at different times, e.g., one step is done prior to (or subsequent to) the other step. Various embodiments are not limited to a particular order.

Exemplary Reading Method

Figure 3:
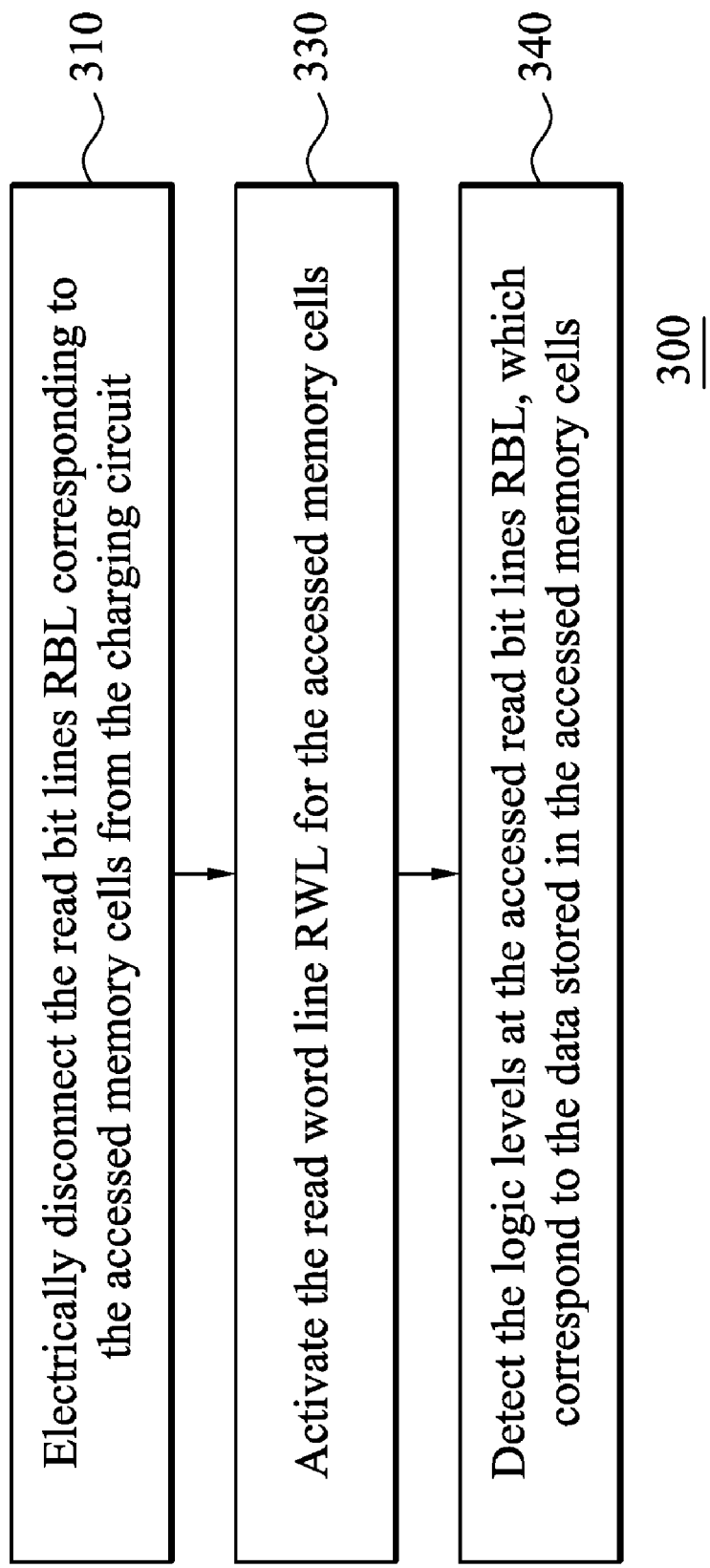
FIG. 3 is a flowchart illustrating a write operation of the circuit in FIG. 1, in accordance with some embodiments.

In some embodiments, reading data from a memory cell 110 results in reading data from memory cells 110 in a row of the memory array. FIG. 3 is a flowchart 300 illustrating a method of reading data from a row (e.g., row R-1) of memory cells 110, in accordance with some embodiments. In an array having n number of rows and m number of columns, row R-1 is called the read access row while row R-2 to row R-n are called the un-accessed rows.

In step 310, read bit lines RBL corresponding to the memory cells 110 in accessed row R-1 are configured to be independent of (e.g., electrically disconnected from) the charging circuit. They, however, remain High at the charged voltage level.

In some embodiments, the read word line RWL corresponding to un-accessed row R-2 to row R-n (e.g., read word lines RWL(2) to RWL(n), not shown) are in a default condition of being deactivated, which turns off transistors N5 in un-accessed row R-2 to row R-n. In effect, deactivated read word lines RWL(2) to RWL(n) prevent data from memory cells 110 in un-accessed row R-2 to row R-n from being read. Deactivated read word lines RWL(2) to RWL(n) also turn off transistor N8 of un-accessed row R-2 to row R-n (e.g., transistors N8(2) to N8(n), not shown). As a result, nodes VSSRA of un-accessed row R-2 to row R-n (e.g., nodes VSSRA(2) to VSSRA(n), not shown) are floating. Because nodes VSSRA (2) to VSSRA(n) are floating, there is no current path through transistors N6 in un-accessed row R-2 to row R-n. Stated differently, any leakage current with respect to the read operation in row R-2 to row R-n is reduced/eliminated.

In step 330, read word line RWL corresponding to accessed row R-1 (e.g., read word line RWL(1), not shown) is activated to turn on transistors N5 of memory cells 110 in accessed row R-1 (e.g., transistors N5(1) in row R-1, not shown). Read word line RWL(1) also turns on transistor N8 of circuit 130 corresponding to accessed row R-1 (e.g., transistor N8(1), not shown). Transistor N8(1) thus serves as a current path for transistors N5 and N6 of accessed row R-1.

In the above steps, the data at the nodes NO of memory cells 110 in a particular column in row R-1 provides the data appeared at the corresponding read bit line RBL. For example, if node NO of a memory cell 110 in row R-1 and column C-1 (e.g., node NO(1,1), not shown) stores a Low, then transistor N6 of row R-1 and column C-1 (e.g., transistor N6(1,1), not shown) is off. As a result, read bit line RBL(1) continues to be High, which corresponds to the Low data of node NO(1,1) or the High data at node NOB(1,1). If, however, node NO(1,1) stores a High, which turns on transistor N6(1, 1). Because read word line RWL(1) is activated, transistor N5 of row R-1 and column C-1 (e.g., transistor N5(1,1)) is on. Because transistor N5(1,1) and transistor N6(1,1) are on, read bit line RBL(1) is pulled to the voltage at the source of transistor N6(1,1) or at node VSSRA(1). In addition, because transistor N8(1) is on, node VSSRA(1), also being the drain of transistor N8(1), is pulled to the voltage level at the source of transistor N8(1), which is ground. In effect, read bit line RBL(1) is pulled to ground or Low, which corresponds to the High data stored in node NO(1,1) or the Low data in node NOB(1,1).

In step 340, the logic levels at the corresponding read bit lines RBL are detected, which reveals the data stored in the corresponding nodes NO and NOB.

Circuit 100 in FIG. 1 is commonly called a one read port, one write port (e.g., 1R1W) circuit. For example, circuit 115 comprising the pair of transistors N5 and N6 together with a read bit line RBL is called a read port. In contrast, a pair of NMOS transistors N3 and N4 together with the corresponding pair of write bit lines WBL and WBLB is called a write port. In some embodiments, a plurality of circuits 115 in a row is coupled to a circuit 130, which reduces/eliminates leakage current with respect to the read operation as explained above. In some embodiments, a write port is associated with a circuit 120 and a write word line WWL, which reduces leakage current with respect to the write operation as explained above. Various variations of circuit 100, e.g., one read port and multiple write ports, multiple read ports and one write port, multiple read ports and multiple write ports, etc., are within the scope of the various embodiments.

Embodiments with Circuit Variations for a Read Operation

Figure 4:
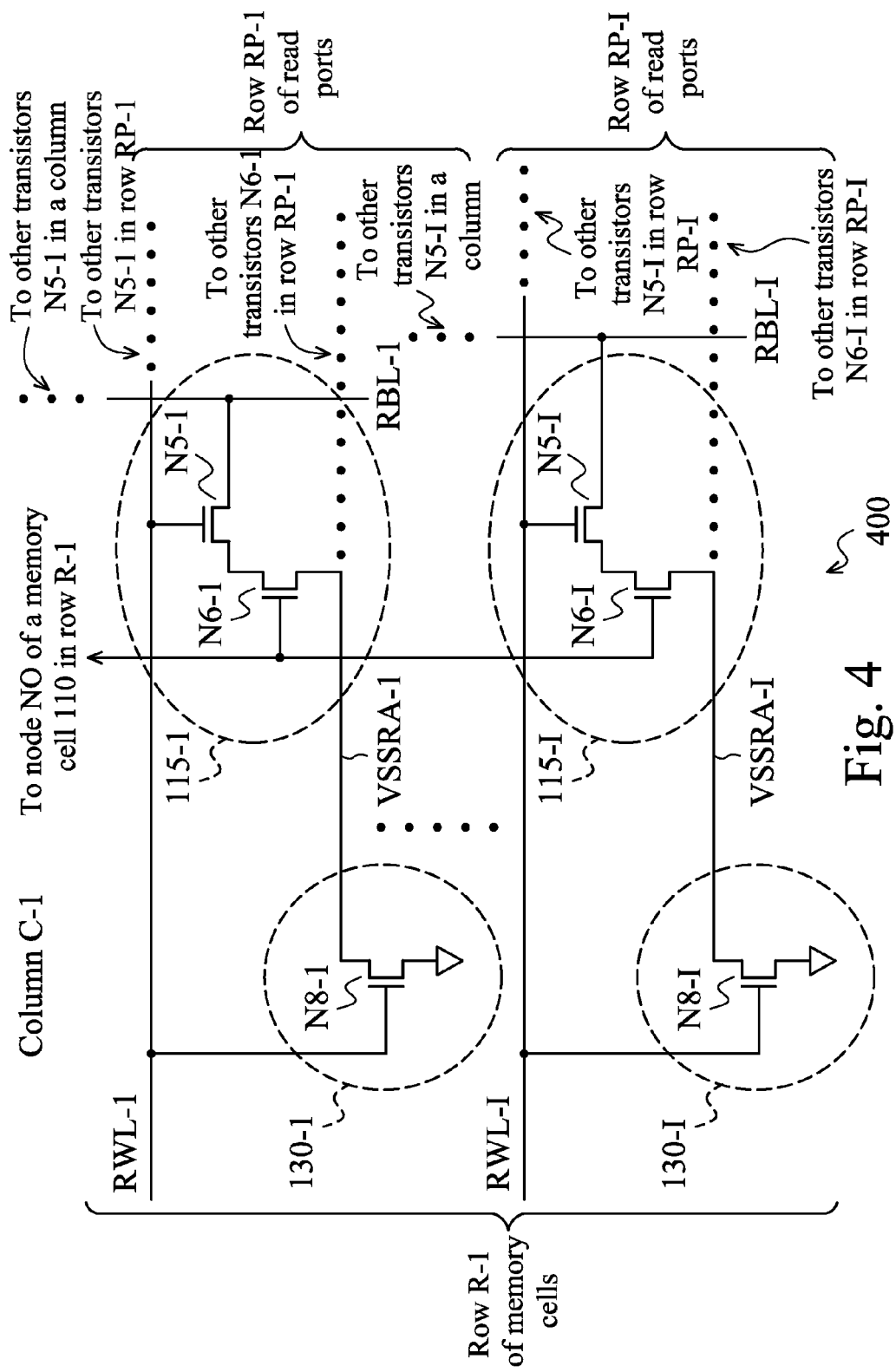
FIG. 4 is a diagram of a circuit illustrating the memory cell in FIG. 1 having I number of read ports, wherein I is a positive number, in accordance with some embodiments.

FIG. 4 shows a diagram of a circuit 400 including I number of read ports associated with a memory cell 110 in a row and a column (e.g., row R-1 and column C-1) of the memory array (e.g., memory cell 110-1-1, not shown), wherein I is a positive number, in accordance with some embodiments. For simplicity, memory cell 110-1-1 and circuitry associated with the write operation for memory cell 110-1-1 are not shown. Because circuit 400 includes I number of read ports per memory cell 110, circuit 400 includes I number of rows (e.g., row RP-1 to row RP-I of read ports), I number of read word lines RWL (e.g., read word lines RWL-1 to RWL-I), I number of circuits 130 (e.g., circuits 130-1 to 130-I), I number circuits 115 (e.g., circuits 115-1 to 115-I), and I number of read bit lines RBL (e.g., read bit lines RBL-1 to RBL-I).

A read word line RWL in FIG. 4 is associated with a row of read ports and is coupled to the gate of transistor N8 and the gates of transistors N5 of circuits 115 of the read ports in the same row. For example, read word line RWL-1 is associated with read ports in row RP-1 and is coupled to the gate of transistor N8-1 of circuit 130-1 and the gates of transistors N5-1 of circuits 115-1 in row RP-1. Read word line RWL-I is associated with row RP-I and is coupled to the gate of transistor N8-I of circuit 130-I and the gates of transistors N5-I of circuits 115-I in row RP-I, etc.

The drain of a transistor N8 of a circuit 130, which is also a node VSSRA, is coupled to the sources of transistors N6 of circuits 115 in a same row of read ports. For example, the drain of transistor N8-1 of circuit 130-1 corresponding to row RP-1 of read ports is coupled to the sources of transistors N6-1 of circuits 115-1 in row RP-1. The drain of transistor N8-I of circuit 130-I corresponding to row RP-I is coupled to the sources of transistors N6-I of circuit 115-I in row RP-I, etc.

In some embodiments, a memory cell 110 is associated with I number of read word lines RWL and I number of circuits 130, and thus I number nodes VSSRA (e.g., node VSSRA-1 to VSSRA-I). When a read port is not active in reading (e.g., a read port in row RP-1 that is not read accessed), the corresponding read word line (e.g., read word line RWL-1) turns off a corresponding transistor N8, e.g., transistor N8-1, which causes the corresponding node VSSRA, e.g., node VSSRA-1, to float, and as a result, the leakage current is reduced as explained above.

A memory cell 110 is also associated with I number of circuits 115 in a column wherein a circuit 115 is in a row of read ports. The gate of transistors N6 of circuits 115 in a same column is coupled together and is coupled to a node of a memory cell 110. For example, the gates of transistors N6-1 to N6-I of circuits 115-1 to 115-I corresponding to the row of read port RP-1 to RP-I are coupled together and coupled to a node (e.g., node NO) of a memory cell (e.g., memory cell 110-1-1).

Each drain of a transistor N5 in a circuit 115 in a row of read ports is coupled to a respective read bit line RBL. For example, the drain of transistor N5-1 of circuit 115-1 in row RP-1 is coupled to read bit line RBL-1, and the drain of transistor N5-I of circuit 115-I in row RP-I is coupled to read bit line RBL-I, etc. Detecting the logic level at one or a plurality of bit lines RBL reveals the data stored in the corresponding node NO and/or node NOB.

In FIG. 1, the gate of transistor N6 in circuit 115 is coupled to node NO of memory cell 110. In some other embodiments, the gate of transistor N6 in circuit 115 is coupled to node NOB, instead of node NO, and the read operation of node NOB is similar to the read operation of node NO. Similarly, in FIG. 4, circuits 115-1 to 115-I are coupled to node NO, but circuits 115-1 to 115-I can be coupled to node NOB instead of node NO. In some embodiments, a memory cell 110 is coupled to one or a plurality of circuits 115 (and associated circuits 130 and read word lines RWL) via a node NO, a node NOB, or both nodes NO and NOB. Stated differently, a memory cell 110 can have one or a plurality of read ports, wherein the one or the plurality of read ports can be associated with one or both storage nodes NO and NOB.

Embodiments with Circuit Variations for a Write Operation

Figure 5:
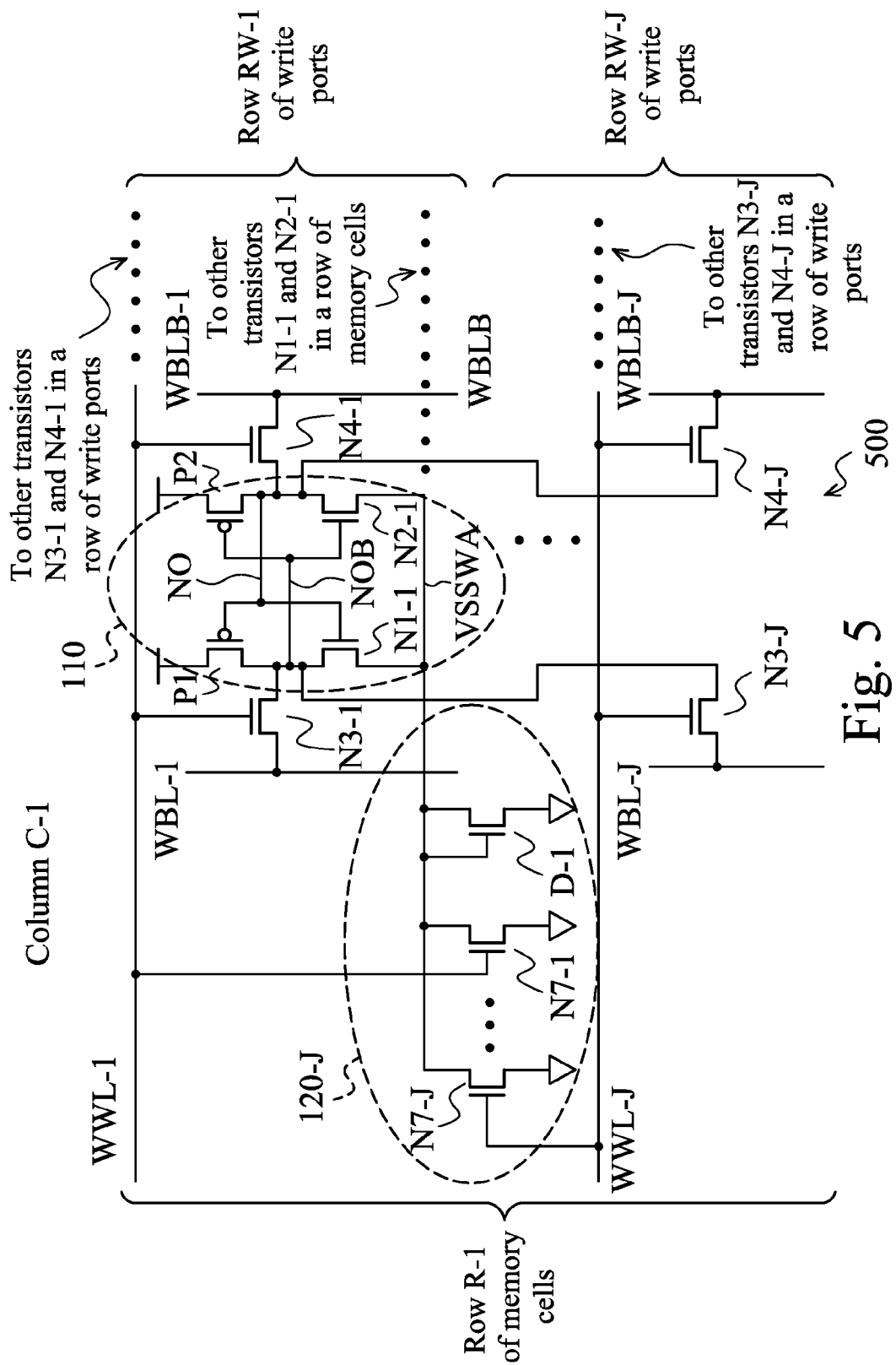
FIG. 5 is a diagram of a circuit illustrating the memory cell in FIG. 1 having J number of write ports, wherein J is a positive number, in accordance with some embodiments.

FIG. 5 is a diagram of a circuit 500 including J number of write ports associated with a memory cell 110 (e.g., memory cell 110-1-1, not shown) in a row and a column (e.g., row R-1 and column C-1) of the memory array, wherein J is a positive number, in accordance with some embodiments. For simplicity, memory cell 110-1-1 and circuitry associated with the read operation for memory cell 110-1-1 are not shown.

A circuit 120-J in FIG. 5 corresponds to a circuit 120 in FIG. 1. Circuit 120-J, however, includes J number of transistors N7 (e.g., transistors N7-1 to N7-J) having their gates coupled to J number of write word lines WWL (e.g., write word lines WWL-1 to WWL-J). For example, the gate of transistor N7-1 is coupled to write word line WWL-1, and the gate of transistor N7-J is coupled to write word line WWL-J, etc. Stated another way, a write word line WWL turns on/off a corresponding transistor N7 in circuit 120-J. When a write word line WWL (e.g., write word line WWL-1) turns on a corresponding transistor N7 (e.g., transistor N7-1), transistor N7-1 serves as a current path for node VSSWA. For example, the current through node VSSWA flows through transistor N7-1.

A write word line WWL is also associated with a pair of transistors N3 and N4, which in turn is associated with a pair of write bit lines WBL and WBLB. For example, write word line WWL-1 is coupled to the gates of transistors N3-1 and N4-1, and write word line WWL-J is coupled to the gates of transistors N3-J and N4-J, etc.

Each pair of transistors N3 and N4 is associated with a pair of respective write bit lines WBL and WBLB. For example, the sources of the pair of transistors N3-1 and N4-1 are coupled to the pair of respective write bit lines WBL-1 and WBLB-1, and the sources of the pair of transistors N3-J and N4-J are coupled to the pair of respective write bit lines WBL-J and WBLB-J, etc. The drains of transistors N3 of the J number of write ports associated with a memory cell 110 are coupled to a storage node of memory cell 110 while the drains of transistors N4 of the J number of write ports associated with the memory cell 110 are coupled to the other storage node. For example, transistors N3-1 to N3-J of J number or write ports associated with memory cell 110-1-1 are coupled to node NOB of memory cell 110-1-1 while transistors N4-1 to N4-J of J number of write ports associated with memory cell 110-1-1 are coupled to node NO of memory cell 110-1-1.

When a write port is selected for writing data to a memory cell 110, the corresponding write word line WWL, transistor N7, write bit line WBL, and pair of transistors N3 and N4 are activated. For example, when write word line WWL-J is activated, write word line WWL-J activates transistor N7-J of circuit 120-J. Node VSSWA coupling memory cells 110 in a same row (e.g., row R1) use transistor N7-J as a current path. Write word line WWL-J also turn on transistors N3-J and N4-J. In the mean time, the write data is placed at the respective write bit line WBL-J and WBLB-J, and is then transferred to nodes NOB and NB through the respective transistors N3-J and N4-J. In some embodiments, writing to a memory cell 110 in a multiple write port situation is similar to writing to a memory cell 110 in a single write port situation. For example, writing to a memory cell results in writing to a plurality of memory cells in a same row of the memory array.

In an un-accessed memory row (e.g., row R-2, not labeled), all write word lines WWL (e.g., write word lines WWL-2 to WWL-J) associated with row R-2 are inactivated, transistors N7-2 to N7-J associated with row R-2 are inactivated, diode D-2 (not labeled) associated with row R-2 is used as a current path for node VSSWA associated with row R-2, and node VSSWA associated with row R-2 is raised by voltage VtD, which reduces leakage current as explained above. In some embodiments, when a row (e.g., row R-1) is accessed, the other rows (e.g., row R-2 to R-n) are un-accessed.

A number of embodiments have been described. It will nevertheless be understood that various modifications may be made without departing from the spirit and scope of the various embodiments. For example, the various transistors being shown as a particular dopant type (e.g., NMOS and PMOS) are for illustration purposes, various embodiments are not limited to a particular type, but the dopant type selected for a particular transistor is a design choice and is within the scope of the various embodiments. The logic level (e.g., low or high) of the various signals used in the above description is also for illustration purposes, embodiments are not limited to a particular level when a signal is activated and/or deactivated, but, rather, selecting such a level is a matter of design choice. Various transistors and diodes (e.g., transistors N7, N8, diodes, D, etc.) function as switches. As a result, switches, switching circuits, devices, network, etc., may be used in place of transistors and/or diodes.

Some embodiments regard a circuit that comprises a plurality of memory cells in a row, at least one write word line, and a write support circuit coupled to the at least one write word line and to the plurality of memory cells in the row. The write support circuit includes a first current path and at least one second current path. A current path of the at least one second current path corresponds to a respective write word line of the at least one write word line. A write word line of the at least one write word line is configured to select the first current path when the plurality of memory cells in the row operates in a first mode, and to select a second current path of the at least one second current path when the plurality of memory cells in the row operates in a second mode.

Some embodiments regard a circuit that comprises a plurality of memory cells in a row, at least one read word line, at least one plurality of read circuits, and at least one read support circuit. A plurality of the read circuits of the at least one plurality of the read circuits corresponds to the plurality of memory cells in the row. A respective read word line of the at least one read word line is coupled to a respective read support circuit of the at least one read support circuit and to the plurality of read circuits of the at least one plurality of read circuits, thereby coupled to a respective read circuit. A memory cell of the plurality of memory cells in the row is coupled to the respective read circuit. The respective read word line is configured to operate the respective read support circuit in a first support mode when the memory cell operates in a first memory mode and to operate the respective read support circuit in a second support mode when the memory cell operates in a second memory mode.

Some embodiments regard a circuit that comprises a plurality of memory cells in a row, a write word line, a write support circuit coupled to the write word line and to a first node coupling the plurality of memory cells in the row, a read word line, a plurality of read circuits, and a read support circuit coupled to the read word line and to a second node coupling the plurality of read circuits. A respective read circuit of the plurality of read circuits corresponds to a respective memory cell of the plurality of memory cells in the row.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A circuit comprising:
   a plurality of memory cells in a row;
   at least one write word line; and
   a write support circuit coupled to the at least one write word line and to the plurality of memory cells in the row, wherein
      the write support circuit includes a first current path and at least one second current path, a current path of the at least one second current path corresponding to a respective write word line of the at least one write word line; and
      a write word line of the at least one write word line is configured to control a transistor to open the first current path when the plurality of memory cells in the row operates in a first mode and to control the transistor to open a second current path of the at least one second current path when the plurality of memory cells in the row operates in a second mode.

2. The circuit of claim 1 wherein:
   the first current path is formed by a diode having one end coupled to the plurality of memory cells in the row; and
   the second current path of the at least one second current path is formed by an NMOS transistor having a drain coupled to the plurality of memory cells in the row and a gate coupled to a write word line of the at least one write word line.

3. The circuit of claim 1 wherein one or a combination of the first current path and the second current path is formed by a switch having one end coupled to the plurality of memory cells in the row.

4. The circuit of claim 1 wherein the write support circuit is configured such that a node coupling the first current path and the at least one second current path is raised by a raised voltage value when the plurality of memory cells in the row operates in the first mode.

5. The circuit of claim 4 wherein the raised voltage value is a voltage dropped across a diode.

6. The circuit of claim 1 further comprising:
   at least one read word line;
   at least one plurality of read circuits, a portion of the read circuits of the at least one plurality of the read circuits corresponding to the plurality of memory cells in the row; and
   at least one read support circuit, a read support circuit of the at least one read support circuit coupled to a node coupling the portion of the read circuits.

7. A circuit comprising:
   a plurality of memory cells in a row;
   at least one read word line;
   at least one plurality of read circuits; a plurality of the read circuits of the at least one plurality of the read circuits corresponding to the plurality of memory cells in the row; and
   at least one read support circuit;
   wherein
      a respective read word line of the at least one read word line is coupled to a respective read support circuit of the at least one read support circuit and to the plurality of read circuits of the at least one plurality of read circuits, thereby coupled to a respective read circuit;
      a memory cell of the plurality of memory cells in the row is coupled to the respective read circuit; and
      the respective read word line is configured to control a transistor of the respective read support circuit in a first support mode when the memory cell operates in a first memory mode and to control the transistor of the respective read support circuit in a second support mode when the memory cell operates in a second memory mode.

8. The circuit of claim 7 wherein:
   the transistor of the respective read support circuit includes a first NMOS transistor having a first gate, a first drain, and a first source;
   the respective read circuit includes a second NMOS transistor having a second gate, a second drain, and a second source and a third NMOS transistor having a third gate, a third drain, and a third source;
   the respective read word line is coupled to the first gate and the second gate;
   the first drain is coupled to the third source;
   the third gate is coupled to a node of the memory cell;
   the third drain is coupled to the second source; and
   the second drain is coupled to a read bit line.

9. The circuit of claim 8 wherein the first NMOS transistor is configured to be on when the respective read support circuit operates in the first support mode, and the first NMOS transistor is configured to be off when the respective read support circuit operates in the second support mode.

10. The circuit of claim 7 wherein the respective read support circuit includes a switch to provide a current path from the plurality of read circuits for the plurality of memory cells in the row.

11. The circuit of claim 7 wherein the respective read support circuit is configured to serve as a current path for the memory cell when the respective read support circuit operates in the first support mode, and the respective read support circuit is configured to be electrically disconnected from the respective read circuit when the respective read support circuit operates in the second support mode.

12. The circuit of claim 7 wherein the memory cell is coupled to the at least one plurality of read circuits via at least one storage node of the memory cell.

13. The circuit of claim 7 wherein the transistor of the respective read support circuit includes an NMOS transistor configured to provide a low logic level for a read bit line coupled to the respective read circuit when the memory cell operates in the first memory mode and configured to float the respective read circuit when the memory cell operates in the second memory mode.

14. The circuit of claim 7 further comprising:
at least one write word line; and
a write support circuit coupled to the at least one write word line and to the plurality of memory cells in the row;
the write support circuit includes a first current path and at least one second current path, a current path of the at least one second current path corresponding to a respective write word line of the at least one write word line.

15. The circuit of claim 14 wherein a write word line of the at least one write word line is configured to select the first current path when the plurality of memory cells in the row operates in a first write mode and to select a second current path of the at least one second current path when the plurality of memory cells in the row operates in a second write mode.

16. A circuit comprising:
a plurality of memory cells in a row;
a write word line;
a write support circuit coupled to the write word line and to a first node coupling the plurality of memory cells in the row;
a read word line;
a plurality of read circuits, a respective read circuit of the plurality of read circuits corresponding to a respective memory cell of the plurality of memory cells in the row; and
a read support circuit coupled to the read word line and to a second node coupling the plurality of read circuits, wherein
the read support circuit is configured to serve as a current path for the second node when the plurality of memory cells in the row operates in a first read mode and to float the second node when the plurality of memory cells in the row operates in a second read mode.

17. The circuit of claim 16 wherein the write support circuit is configured to raise a first node voltage of the first node when the plurality of memory cells in the row operates in a first write mode and to serve as a current path for the first node when the plurality of memory cells in the row operates in a second write mode.

18. The circuit of claim 17 wherein the write support circuit includes:
a diode configured to raise the first node voltage when the plurality of memory cells in the row operates in the first write mode; and
an NMOS transistor configured to serve as the current path for the first node when the plurality of memory cells in the row operates in the second write mode.

19. The circuit of claim 16 further comprising an NMOS transistor configured to serve as a current path for the second node when the plurality of memory cells in the row operates in a first read mode and to float the second node when the plurality of memory cells in the row operates in a second read mode.

* * * * *